(12) United States Patent
Neacsu et al.

(10) Patent No.: US 6,459,324 B1
(45) Date of Patent: Oct. 1, 2002

(54) GATE DRIVE CIRCUIT WITH FEEDBACK-CONTROLLED ACTIVE RESISTANCE

(75) Inventors: Dorin O. Neacsu, Lexington, MA (US); Hoa Huu Nguyen, Cerritos, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 09/983,197

(22) Filed: Oct. 23, 2001

Related U.S. Application Data

(60) Provisional application No. 60/242,172, filed on Oct. 23, 2000.

(51) Int. Cl.[7] .......................... H03K 17/16; H03K 17/30
(52) U.S. Cl. ........................................ 327/379; 327/380
(58) Field of Search .................................... 327/427, 431, 327/434, 435–437, 440, 442, 376, 377, 379, 380, 381

(56) References Cited

U.S. PATENT DOCUMENTS

| | | | | |
|---|---|---|---|---|
| 5,789,951 A | * | 8/1998 | Shen et al. | 327/110 |
| 5,986,484 A | * | 11/1999 | Kimata | 323/908 |
| 6,127,746 A | * | 10/2000 | Clemente | 307/131 |
| 6,194,884 B1 | * | 2/2001 | Kesler et al. | 323/285 |
| 6,208,185 B1 | | 3/2001 | John et al. | 327/170 |
| 6,348,819 B1 | * | 2/2002 | Pierick et al. | 327/108 |

* cited by examiner

*Primary Examiner*—My-Trang Nuton
(74) *Attorney, Agent, or Firm*—Ostrolenk, Faber, Gerb & Soffen, LLP

(57) ABSTRACT

An active resistance is controlled to modify a drive signal provided to a gated device such as an insulated gate bipolar transistor (IGBT). The active resistance is between an input lead that receives an input drive signal, such as from a conventional gate driver IC, and an output lead at which an output drive signal is provided to the device's gate. The active resistance is controlled in response to a feedback signal that includes information about the output drive signal, so that the output drive signal is a modified version of the input drive signal. To reduce di/dt and hence control EMI emission, the output drive signal can include turn-on and turn-off transitions where the input drive signal includes steps. A transition can, for example, include an interval during which the active resistance is greater than zero to reduce peak voltage, another interval during which the active resistance is approximately zero to allow a large gate current, and yet another interval during which the active resistance is greater than zero to limit gate current. The active resistance can be an active resistance device such as a MOSFET resistor, with its channel connected in series between the input and output leads. Similar circuitry can be provided for turn-on and for turn-off. The gate control circuit can be on an integrated circuit with a pin for connecting directly to an IGBT's gate.

21 Claims, 11 Drawing Sheets

GATE DRIVE CIRCUIT WITH FEEDBACK-CONTROLLED ACTIVE RESISTANCE

This application claims the benefit of U.S. Provisional Application Serial No. 60/242,172, filed Oct. 23, 2000.

BACKGROUND OF THE INVENTION

1. Field of the Invention

The present invention relates to a gate drive circuit with a feedback-controlled active resistance. More specifically, the invention relates to a gate drive circuit that modifies the turn-on and turn-off steps in a drive signal to reduce di/dt and therefore electromagnetic interference, particularly for insulated gate devices.

2. Brief Description of the Related Art

Power switches used in power converters are usually insulated gate devices such as insulated gate bipolar transistors (IGBTs). These devices need a special control circuit to provide signals to their gates, usually called a gate driver. Typically, a gate driver has a simple structure that allows application of either positive or negative voltage on the gate.

A. Switching Waveforms

FIG. 1 shows typical switching waveforms that occur at turn-on in an insulated gate device. The waveforms illustrate the slopes of the collector voltage and current and the time intervals on which di/dt ($\delta 1$) and dv/dt ($\delta 2$) are defined.

During the $\delta 0$ time interval, the gate voltage ($V_G$) rises to the threshold level and the collector current $I_C$) equals $I_{dss}$ up to hundreds of $\mu A$. The slope of the gate voltage is given by the input capacitance that is now equal to $C_{iss}$ for the specific device.

During the $\delta 1$ time interval, $I_C$ starts to increase and reaches its maximum equal to the load current. The slope at which $I_C$ increases depends on the gate resistance ($R_{GON}$) and IGBT characteristics. An approximate equation is:

$$\left(\frac{di_d}{dt}\right)_{on} \approx \frac{V_G^+ - V_{GE}(I_L + I_{RM})}{\left(\frac{C_{ies} \cdot R_{GON}}{g_{fe}}\right) + L_E} \quad (1)$$

During the $\delta 2$ time interval, the Miller effect interval keeps the gate voltage at a constant level while the collector-emitter voltage decreases from the DC bus level. The slope of this variation also depends on the gate resistance and is given by an approximate relationship:

$$\left(\frac{dv}{dt}\right)_{on} \approx \frac{V_G^+ - V_{GE}(I_C)}{R_{Gon} \cdot C_{GC}} \quad (2)$$

During the $\delta 3$ time interval, the gate voltage again increases to the control voltage.

FIG. 2 shows typical switching waveforms that occur at turn-off. As above, the waveforms illustrate current and voltage slopes.

During the $\delta 0'$ time interval, the gate voltage ($V_G$) decreases up to the Miller effect level.

During the $\delta 1'$ time interval, the collector-emitter voltage increases to the DC bus voltage and the slope is defined by the gate resistance and the IGBT's characteristics. The slope is given by another approximate relationship:

$$\left(\frac{dv}{dt}\right)_{off} \approx \frac{V_{GE}(I_L) - V_{Gmin}}{R_{Goff} \cdot C_{GC}} \quad (3)$$

During the $\delta 2'$ time interval, the collector current decreases and the slope is approximated by an equation similar to equation (1) above.

B. Influence on EMI

The design of a gate driver has an important influence on the EMI that is generated. It can influence both major types of electromagnetic interference:

differential mode currents flowing into connecting lines due to the IGBT's/diode's switching current (di/dt); and common mode interference produced by the high rate of change of the switching voltage (dv/dt) and parasitic capacitances to the ground or connecting lines.

The level of radiated or conducted EMI depends not only on the gate resistance but also in the converter system parasitics and the pulse width modulation (PWM) method being used.

To control EMI emission, it is necessary to control the switching rate and the voltage and current waveforms based on the values of gate resistance and the switching off voltage (−15V or 0V). For a typical inverter, problems with differential mode EMI constrain the designer to reduce di/dt. The dv/dt levels are imposed by output waveform harmonic considerations and cannot be reduced very much. The harmonic content of the output voltage and switching loss considerations make it impossible to slow down the switching speed. On the contrary, fast dv/dt inverters are sometimes desirable. Recently developed approaches make it possible to control di/dt without affecting dv/dt capability by injecting additional gate current when necessary. Usually designers use such controls to reduce turn-on di/dt and to reduce overvoltage at turn-off.

Gate resistor design is subject to other constraints such as switching power losses, diode recovery transients, and the need to avoid cross-conduction. As used herein, the term "gate resistor" refers to a gate resistor equivalent that can be implemented by various means including, but not limited to, a conventional passive resistor.

Circuit 20 in FIG. 3 illustrates a simplified approach to controlling (di/dt) by controlling gate current with a proposed feedback loop from the emitter of IGBT 22 to the output of gate driver 24. This approach is described in detail in Gerster, C., and Hofer-Noser, P., "Gate-controlled dv/dt and di/dt Limitation in High-Power IGBT Converters," *EPE Journal*, Vol. 5, No. 3/4, January 1996.

There are numerous obvious constraints on implementing this approach, and a number of different solutions have been proposed by those seeking the best implementation. Two main constraints preventing easy implementation are:

a fast event time scale that allows very little delay within the circuit; and feedback dependence on IGBT parameters.

The literature presents many solutions, based on different understandings of the problem. EMI generation is not simple to quantify, and its real sources and their weights in overall EMI generation are not easy to identify. Every possible parasitic in the inverter setup has an influence, and both di/dt and dv/dt contribute through the parasitics, during both turn-on and turn-off.

C. Solution I

Musumeci, S., Raciti, A., Testa, A., Galluzzo, A., and Melito, M., "Switching Behavior Improvement of Insulated Gate-Controlled Devices", *IEEE Trans. On PE*, Vol. 12, No. 4, July 1997, pp. 645–653, propose a solution that shapes gate current during the Miller effect interval. This achieves independent control of the slopes of collector voltage and current. The proposed solution, illustrated by circuit 30 in FIG. 4, supplies pulses of gate current to IGBT 32 at the beginning of the Miller effect interval, speeding up the variation of the collector voltage without changing the slope of the collector current. Problems with this solution relate to detection of the Miller effect zone by sensor 34 and enabling a suitable current pulse generator 36 synchronous with the moment the zone is reached. This is very important to minimize power losses. Maximum loss reduction has been demonstrated by inserting gate current pulses within 20% delay after sensing the Miller effect zone. This can be achieved by an optimal gate-emitter voltage, a strong constant current pulse from generator 36 at turn-on, and a constant current sink 38 at turn-off.

Among the most sensitive parts of this design is implementation of enable modules 40 and 42. The simplest solution is a high gain amplifier that converts information from sensor 34 into signals that, for example, cause generator 36 to provide gate current pulses. The main drawbacks of this solution relate to dependence on circuit speed and to noise. A more complex solution employs a phase locked loop (PLL) circuit to synchronize current pulses on a next-pulse basis. The PLL circuit works to compensate any processing delay. Any phase difference detected by the phase comparator modifies time delay between command signal and gate current pulses, adjusting the phase difference on the next switching.

FIGS. 5 and 6 show examples of relationships between $V_{GE}$ in IGBT 32 and enable signals to current pulse generator 36 and current sink 38, respectively.

D. Solution II

Takizawi, S., Igarashi, S., and Kuroki, K., "A New di/dt Control Gate Drive Circuit for IGBTs to Reduce EMI Noise and Switching Losses", *IEEE* 1998, pp. 1443–1449, propose another solution, a "di/dt suppressor", that limits di/dt at turn-on if collector currents are low. This solution can also be described as improving the diode dv/dt, and hence reducing common mode EMI. At low collector currents, reverse recovery dv/dt of a diode is large and the EMI level is high. The authors state that, for a given gate resistance, EMI is larger at low collector currents than at higher currents. Moreover, different approaches are proposed for turn-on and turn-off.

At turn-on, suppression circuit 70 in FIG. 7 is enabled at small currents through IGBT 72 and limits di/dt. As noted above, diode reverse recovery dv/dt, and therefore EMI noise, is larger at small currents than at large load currents. Therefore, detector 74 receives collector current $I_C$ and provides a high signal when $I_C$ rises. Store 76 provides a signal with information about the last measured load current, providing a high signal when the last load current was small. If both signals are high, AND gate 78 closes switch 80, connecting resistance 82 in parallel with resistance 84 to reduce di/dt at small load currents and also reduce diode dv/dt. The relationship between $V_{GE}$, $I_C$, and the output signal from AND gate 78 are shown in FIG. 8.

At turn-off, collector-emitter voltage rises to a level that is directly proportional to the magnitude of di/dt and also depends on the level of commutated phase current. Suppression circuit 90 in FIG. 9 limits di/dt when collector current for IGBT 92 is falling and load current would be high. Detector 94 receives collector current $I_C$ and provides a high signal when $I_C$ falls. In parallel, detector 96 measures load current and provides a high signal when load current is large. If either signal is low, NAND gate 98 closes switch 100, connecting resistance 102 in parallel with capacitance 104 to reduce di/dt at small load currents. The relationship between $V_{GE}$, $I_C$, and the output signal from NAND gate 98 are shown in FIG. 10.

E. Solution III

A possible solution based on a three stage active gate driver implemented with a closed loop is disclosed in U.S. Pat. No. 6,208,185.

FIG. 11 shows the three stages at turn on, which can be described as follows:

Stage I: This stage minimizes delay time by rapidly charging the IGBT gate with a large gate current.

Stage II: Turn-on di/dt is controlled by a reduced rate of charging the IGBT gate. Injected current is reduced to minimize over-voltage across the complementary switch caused by free-wheeling diode snap-off and the EMI generated by ringing during the reverse recovery transient.

Stage III: The IGBT gate is rapidly charged to reduce tail voltage and decrease power losses.

FIG. 12 shows the three stages at turn off, which can be described as follows:

Stage I: The gate-emitter capacitor discharges rapidly until the collector voltage begins to rise.

Stage II: Gate current is reduced and this results in lower turn-off di/dt and reduced over-voltage during turn-off. This stage continues through the rising period of collector voltage and the falling period of collector current.

Stage III: This stage starts when the collector current stops falling.

FIG. 13 shows circuit 120, an implementation in which rail-to-rail MOSFET transistors 122 and 124, respectively labeled B1 and B2, help provide the high current needed in Stages I and III. Resistors 126 and 128, respectively labeled R1 and R2, limit peak gate current during Stages I and III. Bipolar transistors 130 and 132, respectively labeled M1 and M2, allow precise gate current control during Stage II of the active switching transient.

Table I shows in greater detail how the transistors are controlled during turn-on and turn-off, and the comments indicate the roles played by R1 and R2.

TABLE I

| Switching | Stage | M1 | M2 | B1 | B2 | Comment |
|---|---|---|---|---|---|---|
| Turn-ON | I | ON | OFF | OFF | OFF | Large gate current through R1<R |
|  | II | OFF | OFF | ACT | OFF | B1 controls the gate current in the active region. This allows the gate of the IGBT to be controlled based on the instantaneous load current level and to limit di/dt. |

TABLE I-continued

| Switching | Stage | M1 | M2 | B1 | B2 | Comment |
|---|---|---|---|---|---|---|
| | III | ON | OFF | OFF | OFF | Starts when the collector current reaches the recovery current peak, detected by di/dt=0. |
| Turn-OFF | I | OFF | ON | OFF | OFF | Large gate current through R2<R |
| | II | OFF | OFF | OFF | ACT | B2 actively controls the gate current. |
| | III | OFF | ON | OFF | OFF | Starts at falling edge of the gate current. |

F. Solution IV

The IR3210, a product of the assignee, International Rectifier Corporation, employs a simplified solution that is partly closed loop and takes advantage of predefined current shapes. In this solution, current profiles are programmable through external resistors. FIGS. 14 and 15 show the relationships between $V_{GE}$ and gate current waveforms during turn-on and turn-off, respectively.

It is desirable to have a control circuit for an insulated gate device that overcomes problems with the above solutions, has low response time, and is simple to implement.

SUMMARY OF THE INVENTION

The present invention provides a new gate control technique for gated devices such as IGBTs. The new technique employs an active resistance between input and output leads. The active resistance is controlled in response to a feedback signal that includes information about the output drive signal at the output lead, to provide an output drive signal that is a modified version of the input drive signal.

The new technique can be implemented to obtain optimal di/dt while maintaining dv/dt performance and limiting EMI generation. The new technique is also advantageous because the active resistance can be implemented in a device with a very fast response time, such as a MOSFET resistor. This provides a very simple gate control circuit that can be implemented in an integrated circuit (IC) with an output pin that can be connected directly to the gate of an IGBT, without feedback from the power stage. The feedback for the active gate control is obtained from the RC circuit present on the gate. A gate control circuit can be implemented with fewer components than previous solutions, even those requiring only two external components. Because the active resistance can be implemented in a MOSFET, the new technique can be redesigned. when changing to a new IC technology without modifying the central concept. Further, the active resistance is compatible with the function of desaturation (Desat) protection; in other words, the IC's output stage can perform multiple functions while being controlled by an active resistance.

The new technique can be implemented in a method in which an input drive signal is received at an input lead and, in response to the input drive signal and a feedback signal, an output drive signal for a gated device, such as an IGBT, is provided at an output lead. The feedback signal includes information about the output drive signal. In the method, an active resistance between the input and output leads is controlled in response to the feedback signal so that the output drive signal is a modified version of the input drive signal.

The input drive signal can include turn-on and turn-off steps and the output drive signal can include turn-on and turn-off transitions that are modified forms of the turn-on and turn-off steps. The transition can, for example, include an interval during which the active resistance is greater than zero to reduce peak voltage, another interval during which the active resistance is approximately zero to allow a large gate current, and yet another interval during which the active resistance is greater than zero to limit gate current.

The new technique can be implemented in a gate control circuit that receives input drive signals and, in response, provides output drive signals to the gate of an insulated gate device. The gate control circuit has input and output leads for receiving input drive signals and for providing output drive signals to the device's gate, respectively. Sensing circuitry provides a feedback signal that includes information about an output drive signal provided in response to an input drive signal. Active resistance circuitry provides an active resistance between the input and output leads and responds to the feedback signal by controlling the active resistance so that the output drive signal is a modified version of the input drive signal.

The input drive signal can include turn-on and turn-off steps, as above, and the sensing circuitry can provide a turn-on feedback signal when a turn-on step occurs and a turn-off feedback signal when a turn-off step occurs. The active resistance circuitry can include turn-on circuitry and turn-off circuitry. The turn-on circuitry responds to the turn-on feedback signal by controlling the active resistance to provide a turn-on transition. Similarly, the turn-off circuitry responds to the turn-off feedback signal by controlling the active resistance to provide a turn-off transition. The turn-on and turn-off transitions can reduce di/dt for the insulated gate device.

The active resistance circuitry can include an active resistance device that has a gate lead for receiving a control signal and a channel connected in series between the input and output leads. Resistance of the channel is controlled by the control signal, which can be provided by control signal circuitry in response to the feedback signal. The active resistance device can, for example, be a MOSFET resistor. The feedback signals can, for example, indicate voltage at the output lead and the control signal circuitry can include first stage circuitry, such as a current mirror, for inverting the feedback signals and second stage circuitry for applying the inverted feedback signals to the gate lead of the active device, such as through high and low side transistors.

An integrated circuit can include the gate control circuit. The insulated gate device can be an IGBT, and the integrated circuit can also include an output pin for connecting directly to the gate of the IGBT. The output pin can provide the output drive signal to the IGBT's gate.

Other features and advantages of the present invention will become apparent from the following description of the invention which refers to the accompanying drawings.

DETAILED DESCRIPTION OF THE PREFERRED EMBODIMENTS

Figure 16A:
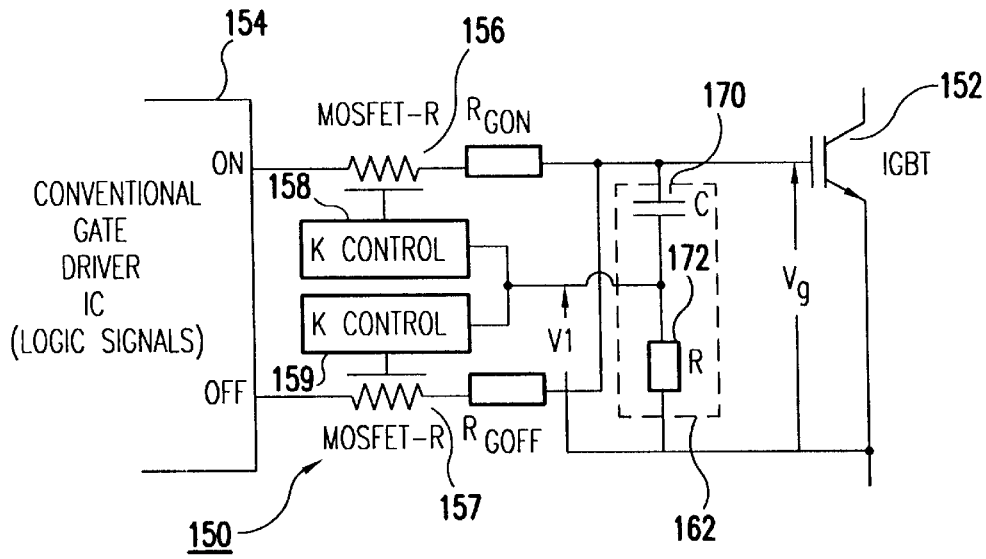
FIGS. 16A and 16B are schematic circuit diagrams showing preferred embodiments of gate control circuits in which a feedback-controlled active resistance modifies a drive signal provided to an IGBT.
Figure 16B:
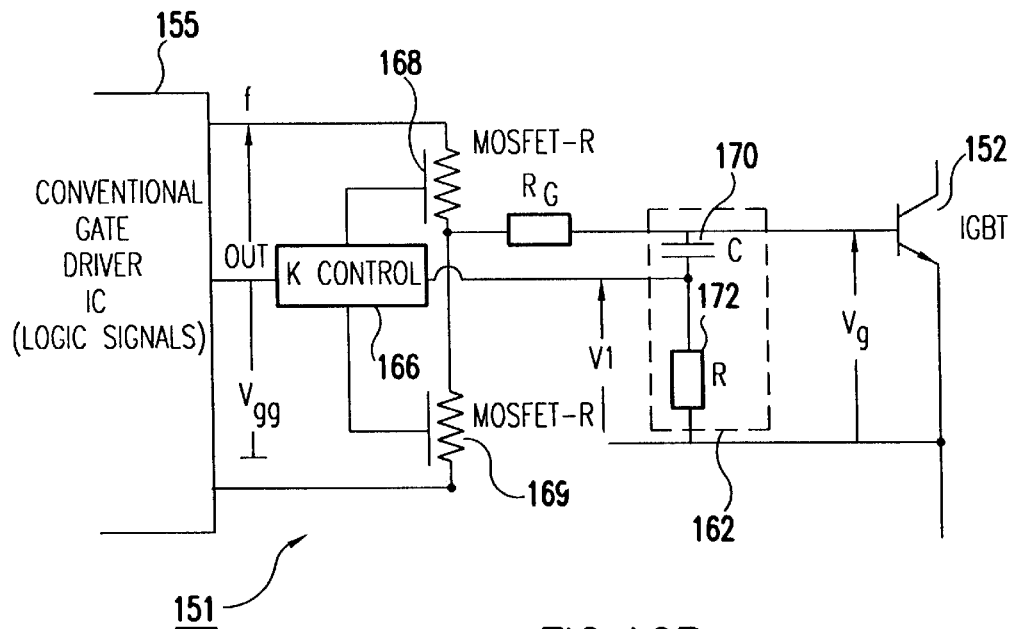

The active resistance gate control circuitry of the present invention is shown in FIGS. 16A and 16B, where FIG. 16A shows the gate control circuitry 150 for use with a conventional gate driver IC 154 provided with two independent outputs (ON and OFF), and FIG. 16B shows the gate control circuitry 151 for a conventional gate driver IC 155 provided with one output (ON/OFF).

Referring first to the embodiment of FIG. 16B, gate control circuit 151 receives a drive signal OUT from gate driver IC 155 and provides an output drive signal Vg to the gate of IGBT 152 (or other MOS-controlled power transistor). As shown, gate control circuit 151 includes sensing circuitry 162 that provides a feedback signal V1 with information about the gate drive voltage to K control circuitry 166, which controls turn-on active resistance device 168 and turn-off active resistance 169.

In the circuitry of FIG. 16A, gate control circuit 150 receives ON and OFF signals on separate leads from gate driver IC 154 and provides an output drive signal Vg to the gate of IGBT 152 (or other MOS-controlled power transistor). In this case, however, the signals from gate driver IC 155 are sent directly to respective active resistance devices 156, 157 which, in conjunction with respective turn on resistors $R_{GON}$ and $R_{GOFF}$, provide the gate drive resistance for turn on and turn off of IGBT 152. As in the circuit of FIG. 16B, sensing circuitry 162 provides feedback signals with information about the gate drive voltage to K control circuitry, which in the case of FIG. 16A, consists of turn-on K control circuitry 158 and turn-off K control circuitry 159 which respectively control turn-on active resistance device 156 and turn-off active resistance device 157.

As shown in FIGS. 16A and 16B, sensing circuitry 162 preferably consists of capacitance 170, labeled C, and resistance 172, labeled R. R and C form an R-C network connected across the gate voltage, and the R-C network should be implemented so that it does not adversely influence the turn-on and turn-off characteristics of IGBT 152. In particular, C must be smaller than the input capacitance Ciss of IGBT 152 so that it does not affect dynamic characteristics of gate voltage. Also, R should be small enough to obtain high bandwidth but big enough to avoid interference with the driving circuit. The particular components shown are merely illustrative, however, and sensing circuitry could be implemented in various other ways to provide feedback signals that include information about the gate voltage. In an integrated circuit implementation, for example, sensing circuitry may include a sensing pin for receiving feedback signals from components external to the IC.

Active resistance devices 156, 157 of FIG. 16A and active resistance device 168 of FIG. 16B are preferably MOSFET resistors, meaning a MOSFET that functions approximately as a resistor across the relevant signal range. A MOSFET resistor provides an especially simple and elegant implementation, but the active resistance devices used in the present invention could be implemented with other active devices that function as resistances across the relevant signal range. More generally, the new techniques could be implemented with any suitable active resistance that can be controlled, where an active resistance is a component that includes one or more active devices such as MOSFETS and that functions as a resistance across the relevant signal range. As used herein, an active resistance can be controlled when its resistance can be changed in a controlled manner, such as by control signals. For example, a gated active resistance such as a MOSFET resistor can be controlled by providing appropriate control signals to its gate.

In the specific examples shown in FIGS. 16A and 16B, the series resistance of the active resistance devices is given by the equation R=ƒ(V1on)=k*Vl, where k is the gain factor provided by the K control circuitry. The design of the K control circuitry should be optimized for the context; outstanding performance may be obtained if the design is device dependent.

Figure 1:
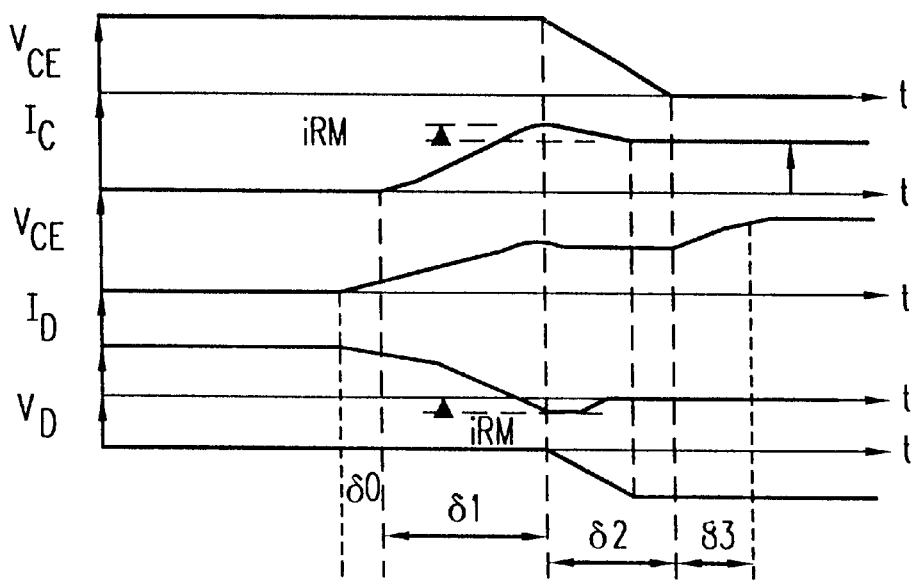
FIGS. 1 and 2 are timing diagrams showing turn-on and turn-off switching waveforms in a conventional IGBT.
Figure 2:
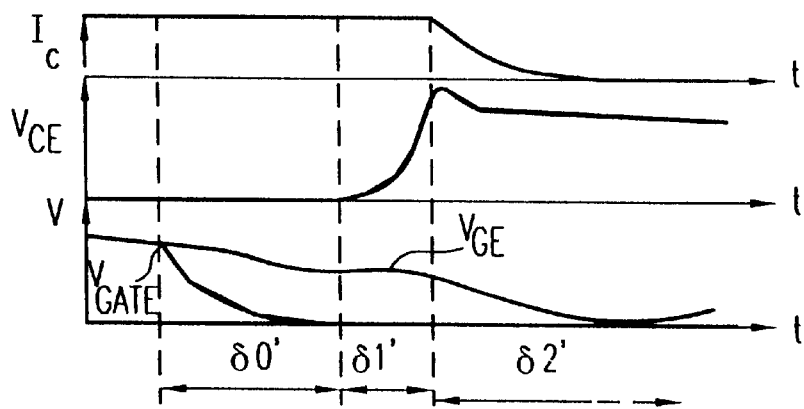
Figure 3:
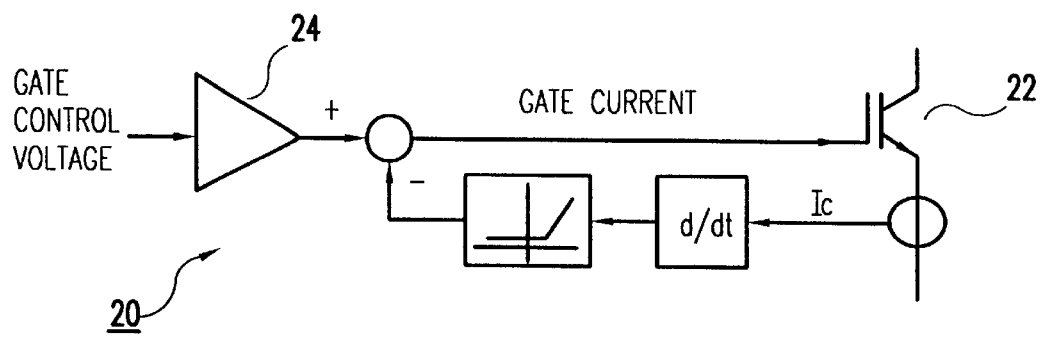
FIG. 3 is schematic circuit diagram showing a previously proposed technique for controlling di/dt by controlling gate current of an IGBT. a timing diagram showing turn-off switching waveforns in an insulated gate device such as an IGBT.
Figure 4:
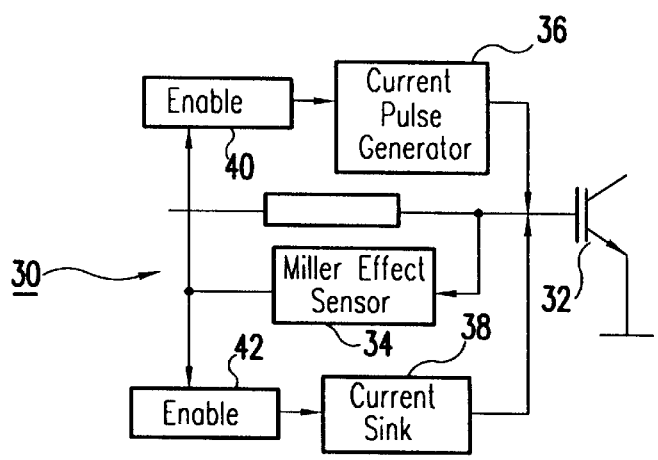
FIG. 4 is a schematic circuit diagram showing one proposal for implementing the technique of FIG. 3.
Figure 5:
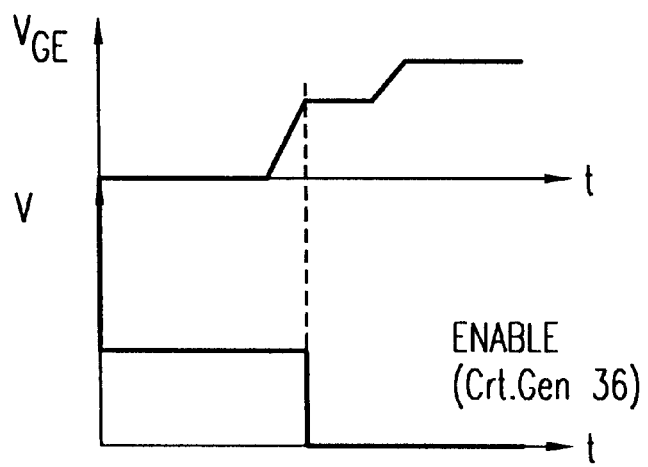
FIGS. 5 and 6 are timing diagrams showing turn-on and turn-off enable waveforms for the circuit of FIG. 4.
Figure 6:
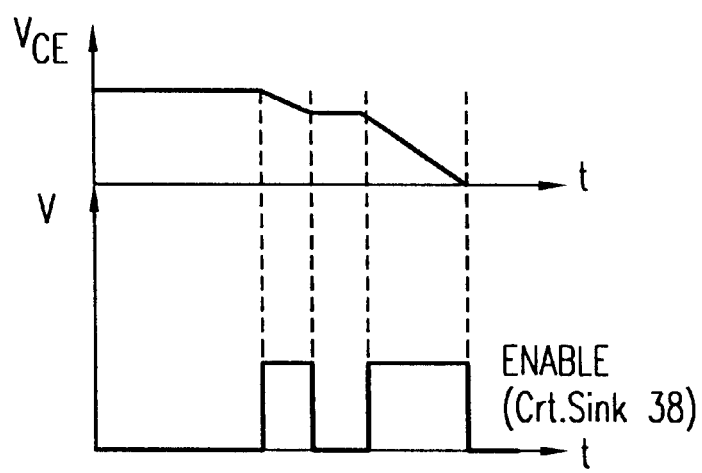
Figure 7:
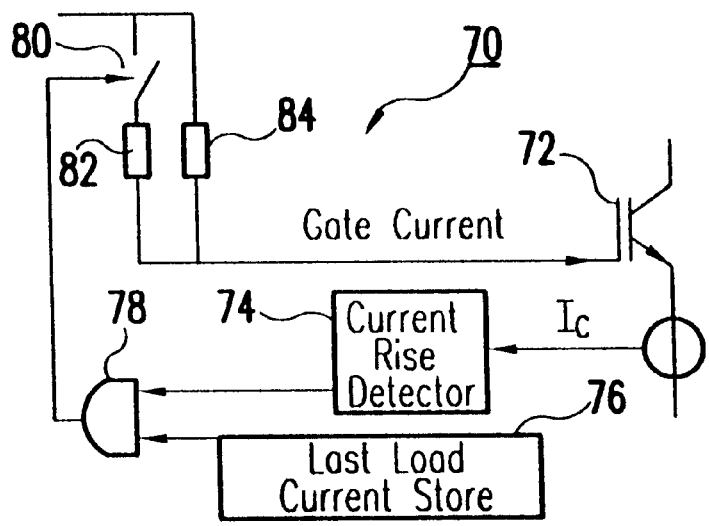
FIG. 7 is a schematic circuit diagram showing another proposal, a turn-on di/dt suppression circuit, for implementing the technique of FIG. 3.
Figure 8:
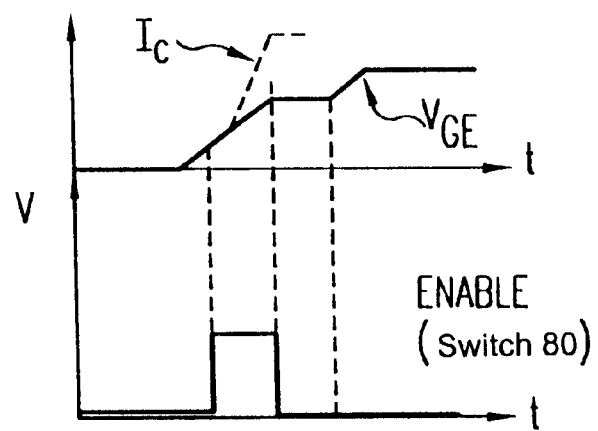
FIG. 8 is a timing diagram showing an enable waveform for the circuit of FIG. 7.
Figure 9:
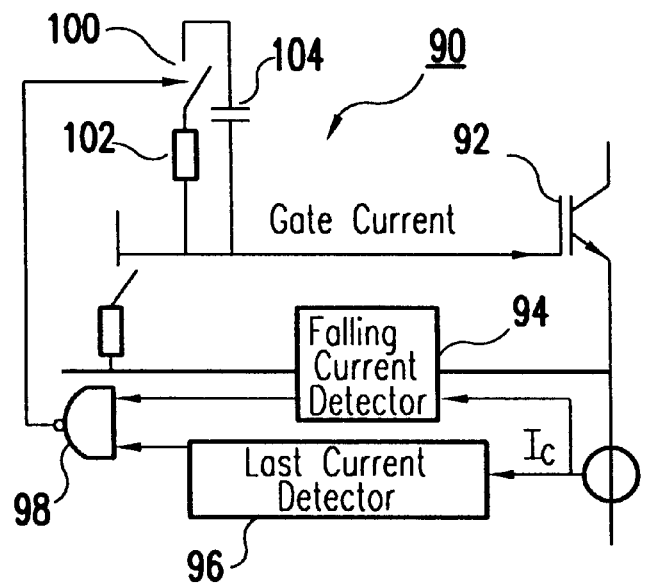
FIG. 9 is a schematic circuit diagram showing a turn-off di/dt suppression circuit for the proposal of FIG. 7.
Figure 10:
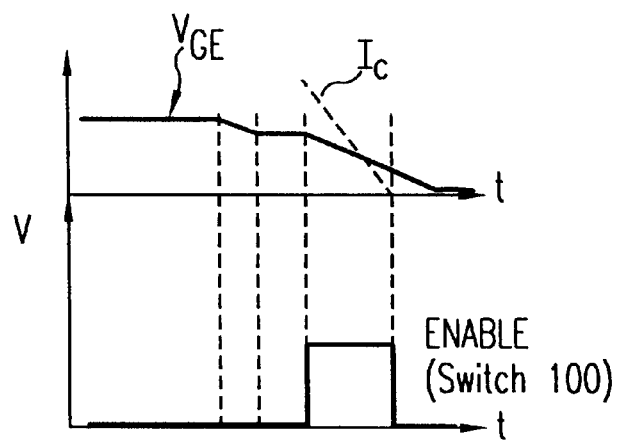
FIG. 10 is a timing diagram showing an enable waveform for the circuit of FIG. 9.
Figure 11:
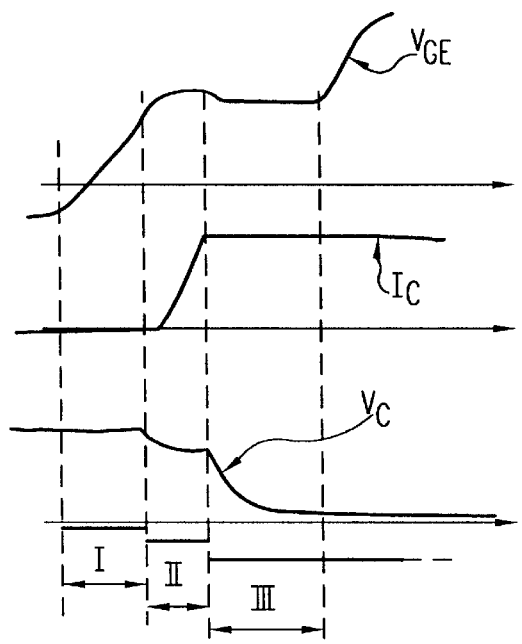
FIGS. 11 and 12 are turn-on and turn-off timing diagrams for another proposal for implementing the technique of FIG. 3.
Figure 12:
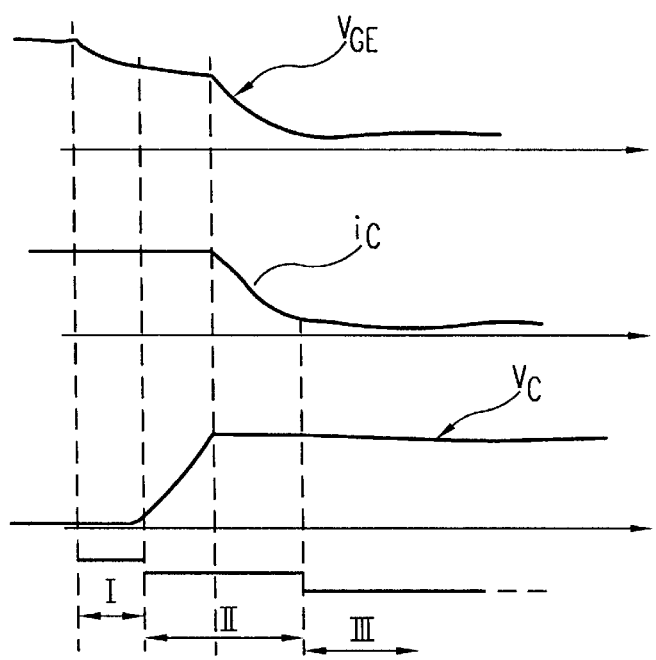
Figure 13:
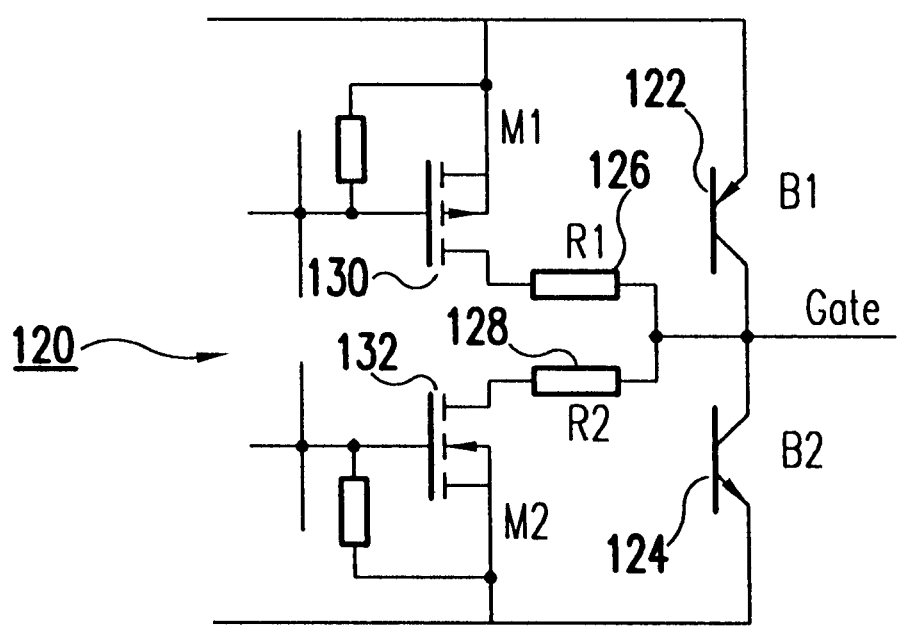
FIG. 13 is a schematic circuit diagram showing circuitry for implementing the proposal of FIGS. 11 and 12.
Figure 14:
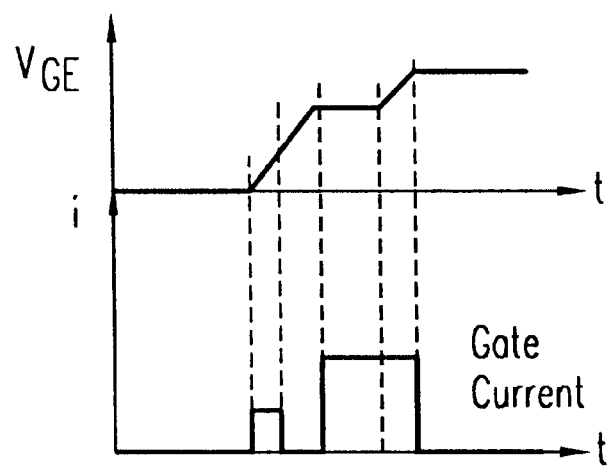
FIGS. 14 and 15 are turn-on and turn-off timing diagrams for the IR3210 product.
Figure 15:
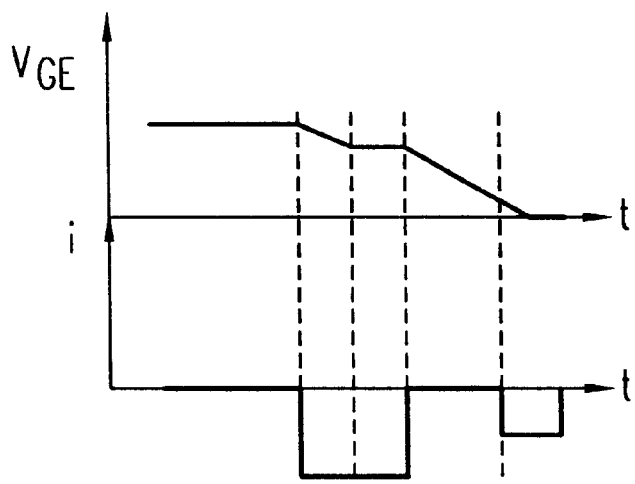

Resistor $R_G$ in FIG. 16B, and resistors $R_{GON}$ and $R_{GOFF}$ of FIG. 16A, are regular constant-value resistors connected in series with the active resistance and have a minimal value sufficient to avoid induced dv/dt turn-on when IGBT 152 is turned off. Time interval δ1 of FIG. 1 (or time t2 of FIG. 17, discussed below), illustrate time periods in which the MOS resistor has a minimal value, and the value of the gate resistor is determined by the fixed resistance $R_G$ in FIG. 16B and resistors $R_{GON}$ and $R_{GOFF}$ of FIG. 16.

Figure 17:
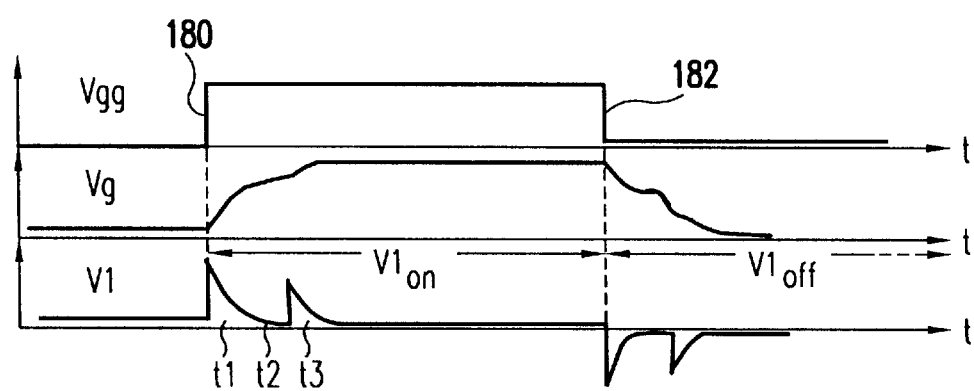
FIG. 17 is a timing diagram showing waveforms during operation of the circuit of the present invention.

FIG. 17 illustrates waveforms Vgg (the gate drive voltage output by the driver IC), Vg (the gate drive voltage applied to the IGBT), and V1 (the output of the sensing circuit 162) that can occur during operation of circuit 150 in FIGS. 16A and 16B. The Vgg waveform, the signal from the driver IC, includes rising and falling edges such as turn-on step 180 and turn-off step 182. It will be understood that the V1 waveform includes V1 on from turn-on step 180 in Vgg until turn-off step 182, includes V1 off from turn-off step 182 until the next turn-on step, and so forth.

As shown, the Vg waveform, the signal applied to the IGBT by the circuit of the present invention, includes a turn-on transition after turn-on step 180 and a turn-off transition after turn-off step 182. These transitions are affected by operation of gate control circuit 150, 151. For example, during an interval around t1, R=kV1>0 helps reduce peak voltage on recovery, such as when IGBT 152 is in an inverter leg, thus reducing EMI. During an interval around t2, R~0 allows a large gate current which improves the switching transient in accordance with the Miller effect. During an interval around t3, R>0 limits gate current on the second slope of the gate voltage; resistance $R_G$ can also help limit gate current. Similar effects occur during the turn-off transition in the Vg waveform following turn-off step 182, during which V1<0 due to a different current direction at turn-off.

Figure 18:
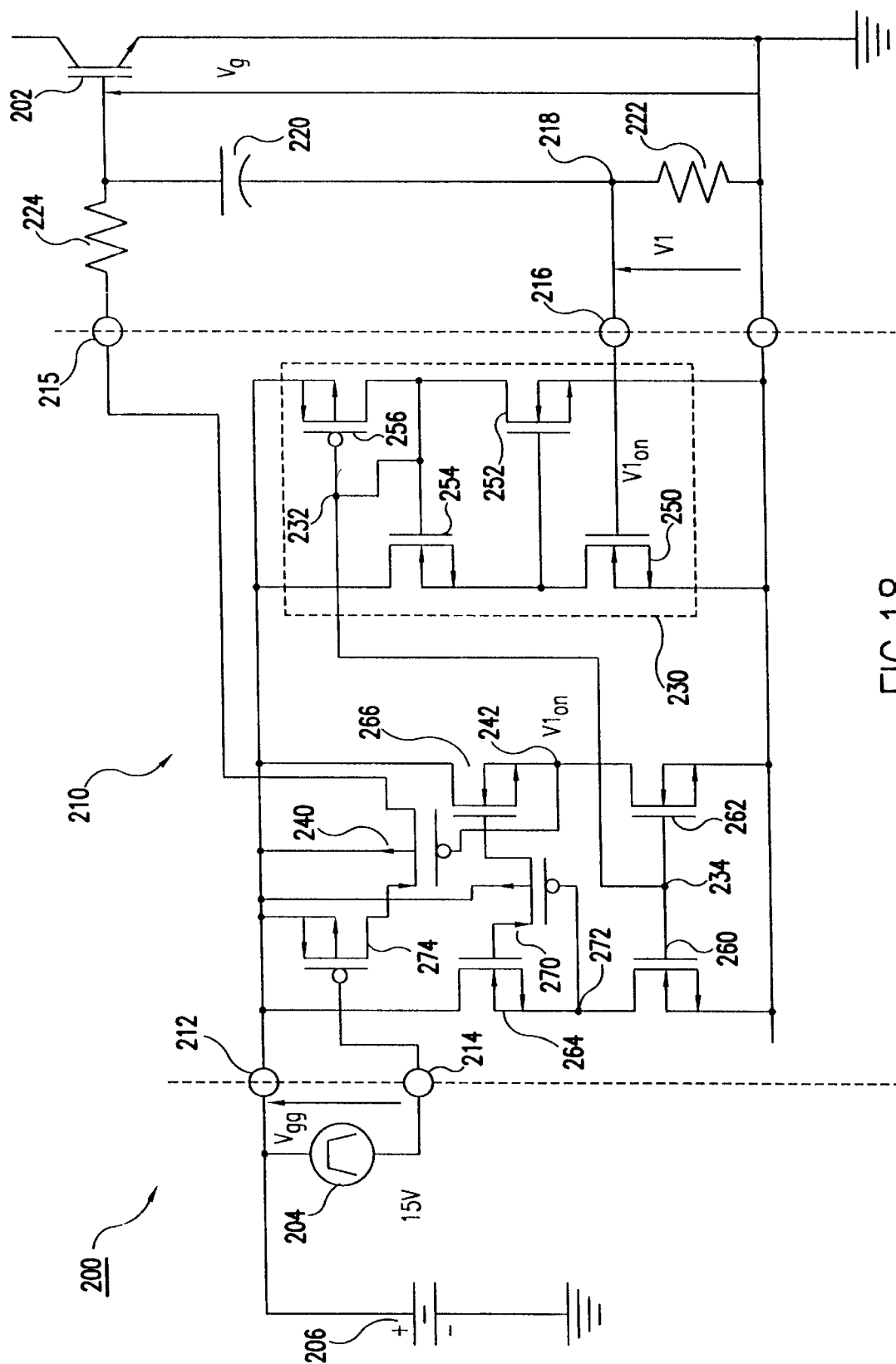
FIG. 18 is a schematic circuit diagram showing an integrated circuit implementation of the turn-on circuitry of the gate control circuitry of the present invention.

Circuit 200 in FIG. 18 illustrates a simple integrated circuit implementation of the turn-on circuitry for driving a MOS-gated device, shown as IGBT 202. The illustrated part of circuit 200 includes a turn-on active resistance and its control circuitry together with related components, and a turn-off active resistance and its control circuitry could be similarly implemented on the same IC. The integrated circuitry shown in FIG. 18, includes in its simplest form: (1) an input stage to receive a signal from the sensing circuitry, (2) a voltage inverter, (3) a voltage amplifier, and (4) an active resistance device, and can be implemented as the final output stage of a driver IC. In FIG. 18, which is exemplary of a possible implementation of the turn-on circuitry, the gate driver is represented as signal source 204, which operates on voltage source 206 and provides an input drive signal to IC 210 across pins 212 and 214. Similarly, an output drive signal is provided through pin 215, and a feedback signal V1on is received through pin 216 from node 218 between capacitance 220 and resistance 222. Capacitor 220, resistor 222, and resistor 224 correspond in function to capacitor 170, resistor 172, and resistor 174 in FIG. 16, but might be implemented on IC 210 rather than with external components as shown. An advantage of external components, however, is that they can be chosen to control commutation speed.

Inverting circuitry 230 receives feedback signal V1on from pin 216, and provides an inverted form of V1on from node 232 to node 234 in a second stage of control signal circuitry. Finally, the control signal for MOSFET resistor 240, an enhancement mode MOSFET designed to have a large linear range, is provided from node 242 in the second stage.

Inverting circuitry 230 illustratively includes a current mirror formed by MOSFETS 250,252, 254, and 256. The second stage of control signal circuitry includes two current paths, each with a low side transistor, MOSFET 260 or MOSFET 262, and a high side transistor, MOSFET 264 or MOSFET 266. The gates of low side MOSFETs 260 and 262 are both connected to receive the inverted feedback signal from node 234. As a result, voltage between the low and high side transistors in each current path reflects the inverted feedback signal.

The floating gates of high side MOSFETs 264 and 266 are connected through MOSFET 270, which is in turn controlled by voltage from node 272 in the current path between MOSFETs 260 and 264. Node 242, which provides the voltage that controls MOSFET resistor 240, is similarly in the current path between MOSFETs 262 and 266. High side MOSFETs 264 and 266 therefore act as controlled resistors, and allow MOSFET resistor 240 to have a larger linear range than if there were only one high side MOSFET.

Finally, enhancement mode MOSFET 274 allows the input drive signal to pass through MOSFET resistor 240 during and after a turn-on step in Vgg.

Circuit 200 thus illustrates a simple gate control circuit that provides a controlled active resistance between input and output leads and can be implemented on an IC directly connected to an IGBT's gate. Circuit 200 has several advantages over previous gate control proposals. For example, some previous proposals used switching devices also used in commutation, which have relatively long transition times compared to devices operated in their active regions as in circuit 200. Also, circuit 200 is simpler and less expensive to implement than the proposal of John et al., described above, which employs more complex gate control circuits, with different output stages for the gate driver, and with load current variation controlling a bipolar junction transistor (BJT) in its active region. In addition, the John et al. proposal requires fast current sensing, fast detection of current slope, and fast transfer of this information to the BJT control circuitry, all of which contribute to its expense.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method of controlling a gated device, comprising:
    receiving an input drive signal at an input lead; and
    in response to the input drive signal and a feedback signal, providing an output drive signal for the device's gate at an output lead, the feedback signal including information about the output drive signal;
    the act of providing the output drive signal including;
        responding to the feedback signal by controlling an active resistance between the input and output leads so that the output drive signal is a modified version of the input drive signal, the act of controlling the active resistance comprising providing an active resistance device that has a gate lead for receiving a control signal and a channel connected in series between the input and output leads, the resistance of the channel being controlled by the control signal; and
        providing the control signal to control the resistance of the active resistance device in response to the feedback signal.

2. The method of claim 1 in which the input drive signal includes turn-on and turn-off steps and the output drive signal includes turn-on and turn-off transitions in response to the turn-on and turn-off steps, respectively; the turn-on and turn-off transitions being modified forms of the turn-on and turn-off steps.

3. A method of controlling a gated device, comprising:
    receiving an input drive signal at an input lead; and
    in response to the input drive signal and a feedback signal, providing an output drive signal for the device's gate at an output lead, the feedback signal including information about the output drive signal;
    the act of providing the output drive signal including;
        responding to the feedback signal by controlling an active resistance between the input and output leads so that the output drive signal is a modified version of the input drive signal;
        the input drive signal including turn-on and turn-off steps and the output drive signal including turn-on and turn-off transitions in response to the turn-on and turn-off steps, respectively; the turn-on and turn-off transitions being modified forms of the turn-on and turn-off steps;

further wherein each transition includes a first interval during which the active resistance is greater than zero to reduce peak voltage, a second interval during which the active resistance is approximately zero to allow a large gate current, and a third interval during which the active resistance is greater than zero to limit gate current.

4. A gate control circuit for a gated device, the gate control circuit receiving input drive signals, and in response, providing output drive signals to the device's gate; the gate control circuit comprising:

input and output leads for receiving input drive signals and for providing output drive signals to the device's gate, respectively;

sensing circuitry that provides a feedback signal that includes information about an output drive signal provided at the output lead in response to an input drive signal received at the input lead; and active resistance circuitry that provides an active resistance between the input and output leads and that responds to the feedback signal by controlling the active resistance so that the output drive signal is a modified version of the input drive signal;

further wherein the input drive signal includes turn-on and turn-off steps and the output drive signal includes turn-on and turn-off transitions in response to the turn-on and turn-off steps, respectively; the turn-on and turn-off transitions being modified forms of the turn-on and turn-off steps;

each transition including a first interval during which the active resistance is greater than zero to reduce peak voltage, a second interval during which the active resistance is approximately zero to allow a large gate current, and a third interval during which the active resistance is greater than zero to limit gate current.

5. The gate control circuit of claim 4 in which the input drive signal includes said turn-on and turn-off steps; the sensing circuitry providing turn-on and turn-off feedback signals that each provide information about the output drive signal; the active resistance circuitry including:

turn-on circuitry that responds to the turn-on feedback signal when a turn-on step occurs by controlling the active resistance to provide a turn-on transition in the output drive signal; and turn-off circuitry that responds to the turn-off feedback signal when a turn-off step occurs by controlling the active resistance to provide a turn-off transition in the output drive signal.

6. The gate control circuit of claim 5 in which the turn-on and turn-off transitions reduce di/dt for the gated device.

7. An integrated circuit that includes the gate control circuit of claim 4, the gated device being an insulated gate bipolar transistor (IGBT), the integrated circuit having an output pin for connecting the output lead directly to the IGBT's gate, the output pin providing the output drive signal to the IGBT's gate.

8. A gate control circuit for a gated device, the gate control circuit receiving input drive signals, and in response, providing output drive signals to the device's gate; the gate control circuit comprising:

input and output leads for receiving input drive signals and for providing output drive signals to the device's gate, respectively;

sensing circuitry that provides a feedback signal that includes information about an output drive signal provided at the output lead in response to an input drive signal received at the input lead; and active resistance circuitry that provides an active resistance between the input and output leads and that responds to the feedback signal by controlling the active resistance so that the output drive signal is a modified version of the input drive signal; further wherein the active resistance circuitry includes:

an active resistance device that has a gate lead for receiving a control signal and a channel connected in series between the input and output leads, the resistance of the channel being controlled by the control signal; and control signal circuitry for providing the control signal in response to the feedback signal.

9. The gate control circuit of claim 8 in which the active resistance device is a MOSFET resistor.

10. The gate control circuit of claim 8 in which the feedback signal indicates voltage at the output lead and the control signal circuitry includes:

first stage circuitry for inverting the feedback signal; and second stage circuitry for applying the inverted feedback signal to the gate lead of the active resistance device.

11. The gate control circuit of claim 10 in which the first stage circuitry includes a current mirror.

12. The gate control circuit of claim 10 in which the second stage circuitry includes first and second current paths between the input lead and ground; the first and second current paths each including a high side transistor and a low side transistor; the gates of the low side transistors both being connected to receive the inverted feed back signal; the gates of the high side transistors being connected to each other through a shunting transistor with its gate connected to be turned on in response to a low voltage between the high and low side transistors in the first current path; the active device's gate lead being connected to receive voltage between the high and low side transistors in the second current path.

13. An integrated circuit that includes the gate control circuit of claim 8, the gated device being an insulated gate bipolar transistor (IGBT), the integrated circuit having an output pin for connecting the output lead directly to the IGBT's gate, the output pin providing the output drive signal to the IGBT's gate.

14. A gate control circuit for a gated device, the gate control circuit receiving input drive signals and, in response, providing output drive signals to the device's gate; the input drive signals including turn-on and turn-off steps; the gate control circuit comprising:

input and output leads for receiving input drive signals and for providing output drive signals to the device's gate, respectively;

sensing circuitry that provides feedback signals that include information about an output drive signal provided at the output lead in response to an input drive signal received at the input lead; the feedback signals including a turn-on feedback signal that provides information about the output drive signal during a turn-on step and a turn-off feedback signal that provides information about the output drive signal during a turn-off step; and active resistance circuitry that provides turn-on and turn-off active resistances in parallel between the input and output leads and that responds to the feedback signal by controlling the turn-on and turn-off active resistances so that the output drive signal is a modified version of the input drive signal; the active resistance circuitry including:

turn-on circuitry that responds to the turn-on feedback signal by controlling the turn-on active resistance to provide a turn-on transition in the output drive signal; and turn-off circuitry that responds to the turn-off feedback signal by controlling the turn-off active resistance to provide a turn-off transition in the output drive signal; further wherein the input drive signal includes turn-on and turn-off steps and the output drive signal includes turn-on and turn-off transitions in response to the turn-on and turn-off steps, respectively; the turn-on and turn-off transitions being modified forms of the turn-on and turn-off steps;

each transition including a first interval during which the active resistance is greater than zero to reduce peak voltage, a second interval during which the active resistance is approximately zero to allow a large gate current, and a third interval during which the active resistance is greater than zero to limit gate current.

15. An integrated circuit that includes the gate control circuit of claim 14, the gated device being an insulated gate bipolar transistor (IGBT), the integrated circuit having an output pin for connecting directly to the IGBT's gate, the output pin providing the output drive signal to the IGBT's gate.

16. A gate control circuit for a gated device, the gate control circuit receiving input drive signals and, in response, providing output drive signals to the device's gate; the input drive signals including turn-on and turn-off steps; the gate control circuit comprising:

input and output leads for receiving input drive signals and for providing output drive signals to the device's gate, respectively;

sensing circuitry that provides feedback signals that include information about an output drive signal provided at the output lead in response to an input drive signal received at the input lead; the feedback signals including a turn-on feedback signal that provides information about the output drive signal during a turn-on step and a turn-off feedback signal that provides information about the output drive signal during a turn-off step; and active resistance circuitry that provides turn-on and turn-off active resistances in parallel between the input and output leads and that responds to the feedback signal by controlling the turn-on and turn-off active resistances so that the output drive signal is a modified version of the input drive signal; the active resistance circuitry including:

turn-on circuitry that responds to the turn-on feedback signal by controlling the turn-on active resistance to provide a turn-on transition in the output drive signal; and turn-off circuitry that responds to the turn-off feedback signal by controlling the turn-off active resistance to provide a turn-off transition in the output drive signal; further wherein each of the turn-on and turn-off circuitry includes:

an active resistance device that has a gate lead for receiving a control signal and a channel connected in series between the input and output leads, the resistance of the channel being controlled by the control signal ; and control signal circuitry for providing the control signal in response to the respective feedback signal.

17. The gate control circuit of claim 16 in which each active resistance device is a MOSFET resistor.

18. The gate control circuit of claim 16 in which each of the turn-on and turn-off feedback signals indicates voltage at the output lead and, in each of the turn-on and turn-off circuitry, the control signal circuitry includes:

first stage circuitry for inverting the respective feedback signal; and second stage circuitry for applying the inverted feedback signal to the gate lead of the respective active resistance device.

19. The gate control circuit of claim 18 in which, in each of the turn-on and turn-off circuitry, the first stage circuitry includes a current mirror.

20. The gate control circuit of claim 18 in which, in each of the turn-on and turn-off circuitry, the second stage circuitry includes first and second current paths between the input lead and ground; the first and second current paths each including a high side transistor and a low side transistor; the gates of the low side transistors both being connected to receive the respective inverted feedback signal; the gates of the high side transistors being connected to each other through a shunting transistor with its gate connected to be turned on in response to a low voltage between the high and low side transistors in the first current path; the respective active device's gate lead being connected to receive voltage between the high and low side transistors in the second current path.

21. An integrated circuit that includes the gate control circuit of claim 16, the gated device being an insulated gate bipolar transistor (IGBT), the integrated circuit having an output pin for connecting directly to the IGBT's gate, the output pin providing the output drive signal to the IGBT's gate.

* * * * *